United States Patent
Zhang et al.

(10) Patent No.: US 10,917,099 B2
(45) Date of Patent: Feb. 9, 2021

(54) METHOD AND DEVICE FOR IMPROVING OUTPUT ACCURACY OF DIGITAL-TO-ANALOGUE CONVERTER

(71) Applicant: GUANGDONG DAPU TELECOM TECHNOLOGY CO., LTD., Guangdong (CN)

(72) Inventors: Hui Zhang, Guangdong (CN); Zhong Yi, Guangdong (CN); Jianbo Lu, Guangdong (CN); Wencai Qiu, Guangdong (CN)

(73) Assignee: GUANGDONG DAPU TELECOM TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/474,108

(22) PCT Filed: Jan. 22, 2017

(86) PCT No.: PCT/CN2017/072061
§ 371 (c)(1),
(2) Date: Jun. 27, 2019

(87) PCT Pub. No.: WO2018/120346
PCT Pub. Date: Jul. 5, 2018

(65) Prior Publication Data
US 2020/0127673 A1   Apr. 23, 2020

(30) Foreign Application Priority Data
Dec. 28, 2016   (CN) .......................... 2016 1 1236988

(51) Int. Cl.
*H03M 1/06* (2006.01)
*H03M 1/10* (2006.01)

(52) U.S. Cl.
CPC ............ *H03M 1/0604* (2013.01); *H03M 1/10* (2013.01); *H03M 1/1014* (2013.01)

(58) Field of Classification Search
CPC ..... H03M 1/0604; H03M 1/10; H03M 1/1014
(Continued)

(56) References Cited

U.S. PATENT DOCUMENTS 5,248,970 A * 9/1993 Sooch ................... H03M 3/356
                                                        341/110
5,381,148 A * 1/1995 Mueck .................... H03G 1/04
                                                        341/120
(Continued)

FOREIGN PATENT DOCUMENTS

CN       101056106 A    10/2007
CN       101322313 A    12/2008
(Continued)

OTHER PUBLICATIONS

International Search Report and Written Opinion Form PCT/ISA/210 and PCT/ISA/237, International Application PCT/CN2017/072061, pp. 1-5, International Filing Date Jan. 22, 2017, dated of search report Sep. 30, 2017.

*Primary Examiner* — Peguy Jean Pierre
(74) *Attorney, Agent, or Firm* — Bond Schoeneck & King, PLLC; George McGuire

(57) ABSTRACT

Disclosed are a method and a device for improving an output accuracy of a digital-to-analog converter. The method includes: calculating an output error of the digital-to-analog converter based on output accuracy and an input error of the digital-to-analog converter; obtaining at least one of the output error, comparing the at least one output error against a preset threshold, and adjusting an integer input value of the digital-to-analog converter according to a comparison result.

12 Claims, 4 Drawing Sheets

(58) Field of Classification Search
USPC .......................................... 341/118, 120, 144
See application file for complete search history.

(56) References Cited

U.S. PATENT DOCUMENTS

| | | | |
|---|---|---|---|
| 6,946,983 B2 * | 9/2005 | Andersson .......... | H03M 1/1033 |
| | | | 341/118 |
| 8,120,517 B2 * | 2/2012 | Saito .................. | H03M 1/1042 |
| | | | 341/118 |
| 8,471,737 B2 | 6/2013 | Iso et al. | |
| 10,348,250 B2 * | 7/2019 | Dempsey .............. | H03F 1/0205 |

FOREIGN PATENT DOCUMENTS

| CN | 102545906 A | 7/2012 |
|---|---|---|
| CN | 202713277 U | 1/2013 |
| CN | 103795415 A | 5/2014 |

* cited by examiner

METHOD AND DEVICE FOR IMPROVING OUTPUT ACCURACY OF DIGITAL-TO-ANALOGUE CONVERTER

CROSS REFERENCE TO RELATED APPLICATIONS

This application is a U.S. National Phase Application of International Patent Application number PCT/CN2017/072061 filed on Jan. 22, 2017, which claims the priority to a China Patent Application No. 201611236988.7 titled "Method and Device for Improving Output Accuracy of Digital-to-Analogue Converter" and filed Dec. 28, 2016 before the State Intellectual Property Office of People's Republic of China, disclosures of both of which are incorporated herein by reference in their entireties.

TECHNICAL FIELD

The present disclosure relates to digital-to-analog converters, for example, to a method and device for improving an output accuracy of a digital-to-analog converter.

BACKGROUND

A digital-to-analog converter (DAC) converts a discrete signal in the form of a binary digital quantity into an analog quantity that based on a standard quantity (or a reference quantity). According to the working principle of a digital-to-analog converter, an n-bit digital-to-analog converter has a resolution of ½n and an input accuracy of 1. If a higher resolution is required in a practical application, then one would need to choose a higher-resolution digital-to-analog converter because the input accuracy cannot be modified. However, the higher the resolution, the more expensive the digital-to-analog converter; and the resolution of the digital-to-analog converter cannot be indefinitely increased.

Furthermore, since the input to the digital-to-analog converter is binary in nature, an integer value can be inputted while a floating point value cannot be inputted. Typically, when a floating point value is inputted, the decimal portion would be ignored, such that the decimal portion would become an input error. The input error has a small effect in a short period of time, but will accumulate into a large integral output error after many inputs.

SUMMARY

It is therefore one object of the present disclosure to provide a method and device for improving an output accuracy of a digital-to-analog converter, which can obtain a higher output accuracy by means of a low-resolution digital-to-analog converter.

In one aspect, the present disclosure provides a method for improving an output accuracy of a digital-to-analog converter. The method includes the following operations:

calculating an output error of the digital-to-analog converter based on an output accuracy and an input error of the digital-to-analog converter;

obtaining at least one of the output error and comparing the at least one output error against a preset threshold; and adjusting an integer input value of the digital-to-analog converter according to a comparison result.

Obtaining at least one of the output error and comparing the at least one output error against the preset threshold and adjusting the integer input value of the digital-to-analog converter according to the comparison result includes the following operations:

accumulating a plurality of consecutive output errors to obtain an accumulative output error;

in response to determining that the accumulative output error is greater than a first threshold, setting the integer input value of the digital-to-analog converter to an integer part of a floating point input value until the accumulative output error is less than a second threshold; and in response to determining that the accumulative output error is less than the second threshold, setting the integer input value of the digital-to-analog converter to an integer part of a floating point input value plus 1 until the accumulative output error is greater than the first threshold.

Obtaining at least one of the output error and comparing the at least one output error against the preset threshold, and adjusting the integer input value of the digital-to-analog converter according to the comparison result includes the following operations:

calculating times of adjustment according to the output accuracy of the digital-to-analog converter and a desired accuracy, where the times of adjustment are greater than or equal to the output accuracy of the digital-to-analog converter divided by the desired accuracy; and in response to an absolute value of one of the at least one output error being greater than the preset threshold, inputting a number of integer input values that corresponds to the times of adjustment into the digital-to-analog converter;

where one of the integer input values is set to an integer part of a floating point input value, and the others of the integer input values are set to an integer part of a floating point input value plus 1.

Calculating the output error of the digital-to-analog converter based on the output accuracy and the input error of the digital-to-analog converter includes the following operations:

obtaining a floating point input value; performing a get-integer operation on the floating point input value to obtain an integer input value;

calculating the input error by subtracting the floating point input value from the integer input value; and calculating the output error obtained after inputting the integer input value into the digital-to-analog converter, the output error equaling the output accuracy times the input error.

Optionally, the first threshold has an absolute value that is equal to an absolute value of the second threshold.

In another aspect, the present disclosure provides a device for improving an output accuracy of a digital-to-analog converter. The apparatus includes an output error calculation module, an error comparison module and an input adjustment module.

The output error calculation module is configured to calculate an output error of the digital-to-analog converter according to an output accuracy and an input error of the digital-to-analog converter.

The error comparison module is configured to obtain at least one of the output error and compare the at least one output error against a preset threshold.

The input adjustment module is configured to adjust an integer input value of the digital-to-analog converter according to a comparison result.

The input adjustment module may be configured to perform the following operations:

accumulating a plurality of consecutive output errors to obtain an accumulative output error;

in response to determining that the accumulative output error is greater than a first threshold, setting the integer input value of the digital-to-analog converter to an integer part of a floating point input value until the accumulative output error is less than a second threshold; and in response to determining that the accumulative output error is less than the second threshold, setting the integer input value of the digital-to-analog converter to an integer part of a floating point input value plus 1 until the accumulative output error is greater than the first threshold.

The input adjustment module may be configured to perform the following operations:

calculating times of adjustment according to the output accuracy of the digital-to-analog converter and a desired accuracy, where the times of adjustment are greater than or equal to the output accuracy of the digital-to-analog converter divided by the desired accuracy;

in response to an absolute value of one of the at least one output error being greater than the preset threshold, inputting a number of integer input values that corresponds to the times of adjustment into the digital-to-analog converter;

where one of the integer input values is set to an integer part of a floating point input value, and the others of the integer input values are set to an integer part of a floating point input value plus 1.

The output error calculation module is configured to perform the following operations:

obtaining a floating point input value;

performing a get-integer operation on the floating point input value to obtain an integer input value;

calculating the input error by subtracting the floating point input value from the integer input value; and calculating the output error obtained after inputting the integer input value into the digital-to-analog converter, the output error equaling the output accuracy times the input error.

Optionally, the first threshold has an absolute value that is equal to an absolute value of the second threshold.

The present disclosure further provides a non-transitory storage medium, configured to store computer-executable instructions which are configured for performing the method for improving an output accuracy of a digital-to-analog converter described above.

The present disclosure further provides a computer program product including a computer program stored on a non-transitory computer-readable storage medium, where the computer program includes program instructions which, when executed by a computer, cause the computer to perform the method for improving an output accuracy of a digital-to-analog converter described above.

The present disclosure further provides an electronic device which includes at least one processor and a memory communicatively coupled to the at least one processor, where the memory is configured to store instructions which are executable by the at least one processor, and which, when executed by the at least one processor, cause the at least one processor to perform the method for improving an output accuracy of a digital-to-analog converter described above.

The present disclosure further provides a digital-to-analog converter that includes the electronic device or the device for improving an output accuracy of a digital-to-analog converter described above.

According to the method and device for improving an output accuracy of a digital-to-analog converter in the present disclosure, an output error of the digital-to-analog converter is calculated when a floating point value is input, and the output error is then compared against a preset threshold, and an integer input value of the digital-to-analog converter is adjusted according to the comparison result, thereby achieving an equivalent of a higher output accuracy without needing to replace the low-resolution digital-to-analog converter with a high-resolution digital-to-analog converter and re-designing the circuitry.

BRIEF DESCRIPTION OF THE ACCOMPANYING DRAWINGS

DETAILED DESCRIPTION

To provide a better understanding for the technical problems to be solved, technical solutions adopted and technical effects to be achieved by the present disclosure, the solutions embodied in the embodiments of the present disclosure will be described in further detail in connection with the drawings. Apparently, the embodiments described below are merely part rather than all of the embodiments of the present disclosure.

An embodiment of the present disclosure provides a method for improving an output accuracy of a digital-to-analog converter, which is applied to adjust an input value of the digital-to-analog converter in cases where the digital-to-analog converter has an output error, so as to eliminate an input error when inputting a floating point value.

Figure 1:
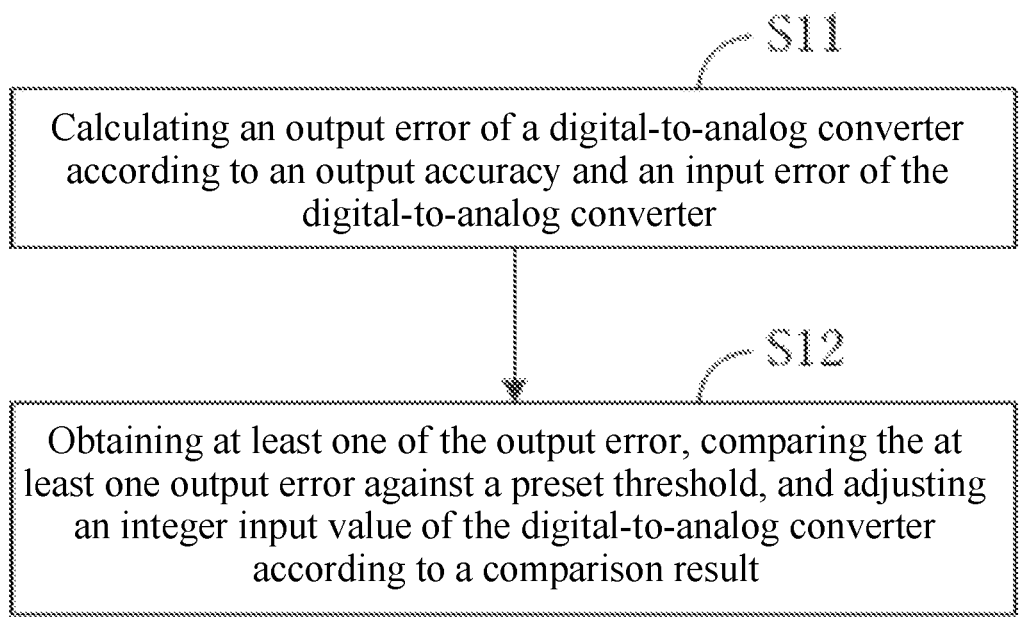
FIG. 1 is a flowchart illustrating a method for improving an output accuracy of a digital-to-analog converter according to an embodiment of the present disclosure.

FIG. 1 is a flowchart illustrating a method for improving an output accuracy of a digital-to-analog converter according to an embodiment of the present disclosure. As illustrated in FIG. 1, the method includes steps S11 and S12.

In S11, an output error of the digital-to-analog converter is calculated according to an output accuracy and an input error of the digital-to-analog converter.

A floating point input value is obtained. A get-integer operation is performed on the floating point input value to obtain an integer input value. The get-integer operation means to get an integer part of the floating point input value omitting a decimal part of the floating point input value. The input error is calculated by subtracting the floating point input value from the integer input value. The output error obtained after the integer input value is inputted into the digital-to-analog converter is calculated by multiplying the output accuracy by the input error. The output accuracy is $1/2^n$, where n is the number of bits of the digital-to-analog converter.

For example, if a floating point value 1.5 is inputted, an integer value obtained by the get-integer operation is 1, the input error is −0.5, a result of 1.5 subtracted from 1, the output accuracy of a three-bit digital-to-analog converter is 0.125 by $1/2^3=1/8=0.125$, and the output error is −0.0625 by −0.5*0.125=−0.0625.

In S12, at least one of the output error is obtained and is compared against a preset threshold, and the integer input value of the digital-to-analog converter is adjusted according to a comparison result.

Figure 2:
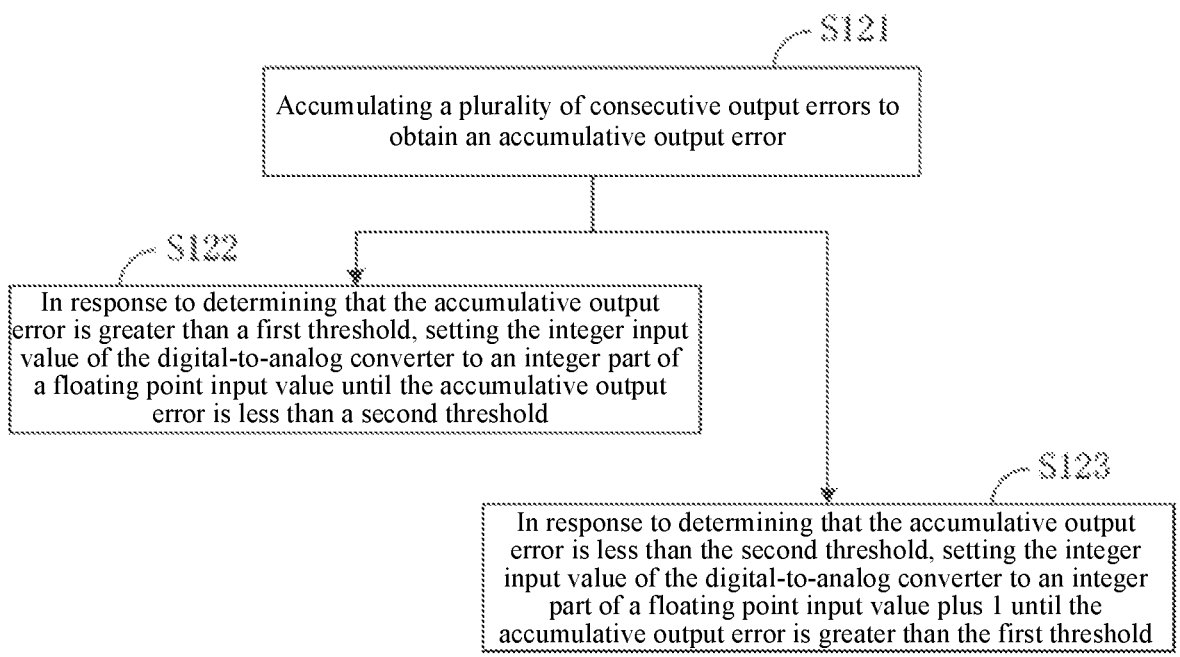
FIG. 2 is a flowchart illustrating a process for adjusting an integer input value of a digital-to-analog converter according to an embodiment of the present disclosure.

FIG. 2 is a flowchart illustrating a process for adjusting an integer input value of a digital-to-analog converter according to an embodiment of the present disclosure. As illustrated in FIG. 2, step S12 includes steps S121 through S123.

In S121, a plurality of consecutive output errors are accumulated to obtain an accumulative output error.

In S122, if the accumulative output error is greater than a first threshold, the integer input value of the digital-to-analog converter is set to an integer part of a floating point input value until the accumulative output error is less than a second threshold.

In S123, if the accumulative output error is less than the second threshold, the integer input value of the digital-to-analog converter is set to an integer part of a floating point input value plus 1 until the accumulative output error is greater than the first threshold.

In this embodiment, the preset threshold includes the first threshold and the second threshold, and the preset threshold is set according to a frequency at which the integer input value needs to be adjusted. The smaller an absolute value of the preset threshold, the more frequently the integer input value is adjusted. Generally, the absolute value of the preset threshold is less than 1, the first threshold value is greater than or equal to 0, and the second threshold value is less than or equal to 0. Optionally, an absolute value of the first threshold value may be set equal to an absolute value of the second threshold.

An equivalent output accuracy of the digital-to-analog converter equals a maximum accumulative output error divided by time of execution of the adjustment method. For example, the first threshold is 0.5 and the second threshold is −0.5. Assuming that the accumulative output error is equal to 0.5625 after an x-th input, which is greater than the first threshold, so that the integer input value starts to be adjusted. Of the time of execution of the adjustment method is 40 seconds, then the equivalent output accuracy would 0.014, which is a result of 0.5265 divided by 40. If the time of execution of the adjustment method is 200 seconds, then the equivalent output accuracy would be 0.0028, which is a result of 0.5265 divided by 200. The longer the time of execution of the adjustment method, the higher the equivalent output accuracy of the digital-to-analog converter.

In addition, a higher equivalent output accuracy may be achieved by increasing the frequency of adjustment. If 40 integer input values are input per second, the equivalent output accuracy would be 0.014, a result of 0.5265 divided by 40. If 200 integer input values are input per second, then the equivalent output accuracy would be 0.0028, a result of 0.5265 divided by 200.

Depending on requirements of specific applications, the adjustment can be set as irregular inputs, where a time interval between two inputs may be unequal.

This embodiment is applicable to adjusting the accumulative output error. By adjusting the integer input value of the digital-to-analog converter, the output error can be eliminated, thereby improving the output accuracy of the digital-to-analog converter in an equivalent manner.

Optionally, another embodiment of the present disclosure provides a method for improving an output accuracy of a digital-to-analog converter that includes steps S21 and S22.

In S21, an output error of the digital-to-analog converter is calculated according to an output accuracy and an input error of the digital-to-analog converter.

In S22, at least one of the output error is obtained and is compared against a preset threshold, and an integer input value of the digital-to-analog converter is adjusted according to a comparison result.

Figure 3:
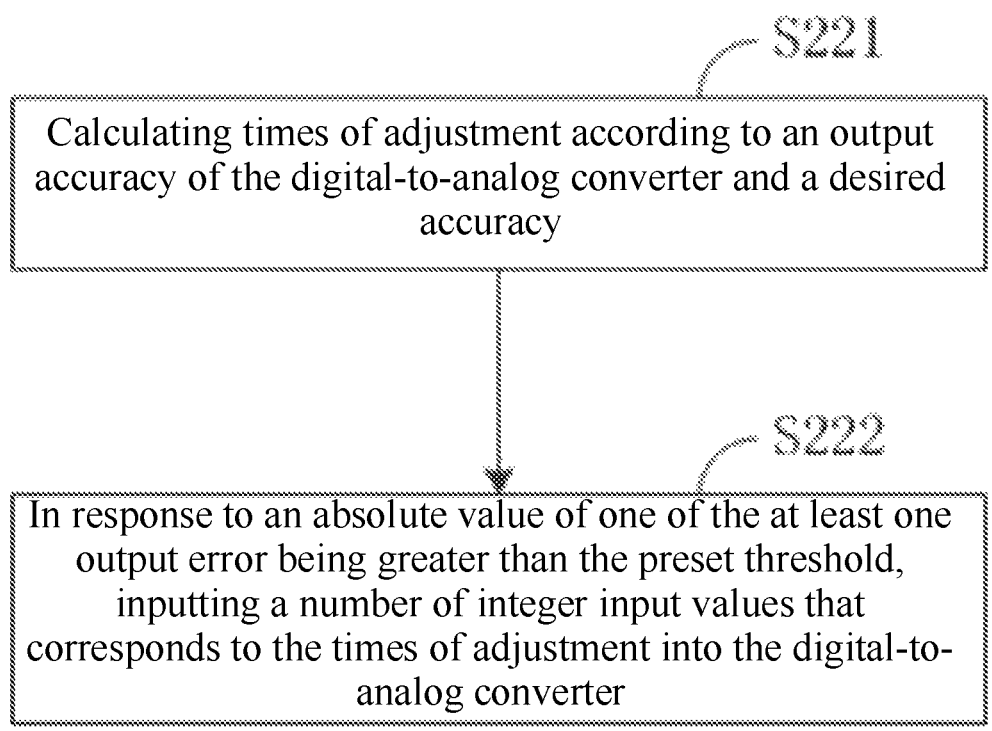
FIG. 3 is a flowchart illustrating a process for adjusting an integer input value of a digital-to-analog converter according to an embodiment of the present disclosure.
Figure 4:
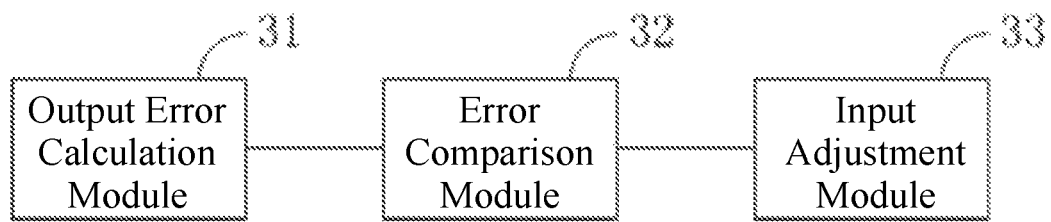
FIG. 4 is a block diagram illustrating a device for improving an output accuracy of a digital-to-analog converter according to an embodiment of the present disclosure.

FIG. 3 is a flowchart illustrating a process for adjusting an integer input value of a digital-to-analog converter according to an embodiment of the present disclosure. As illustrated in FIG. 3, step S12 may further include steps S221 and S222.

In S221, times of adjustment are calculated according to the output accuracy of the digital-to-analog converter and a desired accuracy.

The times of adjustment are obtained by rounding a value obtained by dividing the output accuracy of the digital-to-analog converter by the desired accuracy, where the times of adjustment are greater than or equal to the output accuracy of the digital-to-analog converter divided by the desired accuracy.

In S222, if an absolute value of one of the at least one output error is greater than the preset threshold, a number of integer input values that corresponds to the times of adjustment are input into the digital-to-analog converter.

One of the integer input values is set to an integer part of a floating point input value, and the others of the integer input values are set to an integer part of a floating point input value plus 1.

For example, if data with accuracy of $\frac{1}{32}$ is to be output using a three-bit digital-to-analog converter with an output accuracy of $\frac{1}{8}$, the times of adjustment may be calculated to be at least 4 times according to the above formula. The floating point input value is 1.5, the integer input value obtained by getting the integer part of the floating point input value is 1, the input error is −0.5, the output error is −0.0625, and an absolute value of the output error is greater than the preset threshold $\frac{1}{32}$. A first input is 1, and the next three inputs are each an integer part of 1.5 plus 1, namely, 2. After four inputs, an accumulative output error is 0.125, and an average output error for each input is 0.03125, a result of 0.125 divided by 4. An equivalent output error is $\frac{1}{32}$ after the four inputs, equivalently improving the accuracy. Similarly, if a higher equivalent accuracy is desired, merely more time is needs, or more inputs needs to be performed within the same period of time. Therefore, input and output of the digital-to-analog converter may be accurately controlled by calculations.

This embodiment is applicable to cases where a low-resolution digital-to-analog converter needs to be used to output high-accuracy data. Because the low-resolution digital-to-analog converter cannot provide a required accuracy, the output error would exceed the preset threshold due to the output error of only one input, so that the next several inputs would need to be adjusted. The number of integer values to be inputted is calculated according to the desired accuracy and the output accuracy of the digital-to-analog converter, and the integer input values are set according to a preset rule in order to make multiple low-accuracy inputs be an equivalent of one high-accuracy input.

An embodiment of the present disclosure further provides a device for improving an output accuracy of a digital-to-analog converter, configured to execute the method described in the above-mentioned embodiments.

The device includes an output error calculation module 31, an error comparison module 32, and an input adjustment module 33.

The output error calculation module 31 is configured to calculate an output error of the digital-to-analog converter according to an output accuracy and an input error of the digital-to-analog converter.

The error comparison module 32 is configured to obtain at least one of the output error and compare the at least one output error against a preset threshold.

The input adjustment module 33 is configured to adjust an integer input value of the digital-to-analog converter according to a comparison result.

The input adjustment module 33 is configured to perform the following operations:

accumulating a plurality of consecutive output errors to obtain an accumulative output error;

if the accumulative output error is greater than a first threshold, setting the integer input value of the digital-to-analog converter to an integer part of a floating point input value until the accumulative output error is less than a second threshold; and if the accumulative output error is less than the second threshold, set the integer input value of the digital-to-analog converter to an integer part of a floating point input value plus 1 until the accumulative output error is greater than the first threshold.

Optionally, the input adjustment module 33 is configured to perform the following operations:

calculating times of adjustment according to the output accuracy of the digital-to-analog converter and accuracy desired accuracy, where the times of adjustment are greater than or equal to the output accuracy of the digital-to-analog converter divided by the desired accuracy;

if an absolute value of one of the at least one output error is greater than the preset threshold, inputting a number of integer input values that corresponds to the times of adjustment into the digital-to-analog converter; where one of the integer input values is set to an integer part of the floating point input value, and the others of the integer input values are set to an integer part of the floating point input value plus 1.

The output error calculation module 31 is configured to perform the following operations;

obtaining a floating point input value;

performing a get-integer operation on the floating point input value to obtain an integer input value;

calculating the input error by subtracting the floating point input value from the integer input; and calculating the output error obtained after inputting the integer input value into the digital-to-analog converter by multiplying the output accuracy by the input error.

Optionally, the first threshold has an absolute value that is equal to an absolute value of the second threshold.

In this embodiment, an output error of the digital-to-analog converter is calculated when a floating point value is inputted, and the output error is then compared against a preset threshold, such that the integer input value of the digital-to-analog converter is adjusted according to the comparison result, thereby achieving a higher equivalent output accuracy without needing to replace a low-resolution digital-to-analog converter with a high-resolution digital-to-analog converter and re-designing the circuitry.

The output error calculation module 31, the error comparison module 32, and the input adjustment module 33 may be implemented or realized with a general purpose processor, a digital signal processor (DSP), an application specific integrated circuit (ASIC), a field programmable gate array (FPGA) or another programmable logic apparatus, discrete gate or transistor logic, discrete hardware components, or any combination thereof designed to execute the functions described herein. The general purpose processor may be a microprocessor; in alternative solutions, the processor may also be any conventional processor, controller, microcontroller, or state machine. The processor may also be implemented as a combination of computing devices, such as a combination of the DSP and the microprocessor, a plurality of microprocessors, one or more microprocessors in conjunction with a DSP core, or any other such configuration.

The present disclosure further provides a non-transitory storage medium, configured to store computer-executable instructions that are configured for performing the method for improving an output accuracy of a digital-to-analog converter described above.

The present disclosure further provides a computer program product including a computer program stored on a non-transitory computer-readable storage medium, where the computer program includes program instructions which, when executed by a computer, cause the computer to perform the method for improving output accuracy of a digital-to-analog converter described above.

Figure 5:
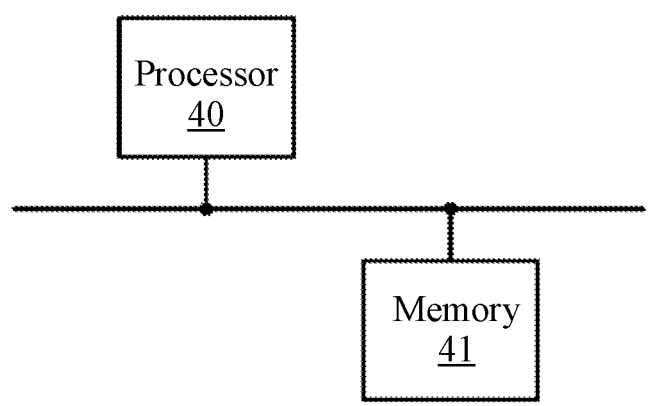
FIG. 5 is a block diagram illustrating an electronic device according to an embodiment of the present disclosure.

As illustrated in FIG. 5, the present disclosure further provides an electronic device that includes at least one processor 40 and a memory 41 communicatively coupled to the at least one processor, where the memory 41 is configured to store instructions which are executable by the at least one processor 40, and which, when executed by the at least one processor 40, cause the at least one processor 40 to perform the method for improving an output accuracy of a digital-to-analog converter described above.

The present disclosure further provides a digital-to-analog converter that includes the electronic device described above and a digital to analog conversion circuitry. The digital to analog conversion circuit includes, for example, a resistance network and a switch.

The foregoing depicts the technical principles of the present disclosure in connection with specific embodiments. The foregoing description is merely intended for explaining the principles of the present disclosure, and should not be construed as limiting the scope of present disclosure. Based on this explanation, other specific embodiments of the present disclosure conceivable by those skilled in the art without creative efforts shall all fall in the scope of the present disclosure.

INDUSTRIAL APPLICABILITY

The method and device for improving an output accuracy of a digital-to-analog converter according to the present disclosure can achieve an equivalent of a higher output accuracy without needing to replace a low-resolution digital-to-analog converter with a high-resolution digital-to-analog converter and re-designing the circuitry.

What is claimed is:

1. A method for improving an output accuracy of a digital-to-analog converter, comprising:
    calculating an output error of the digital-to-analog converter based on an output accuracy and an input error of the digital-to-analog converter;
    obtaining at least one of the output error and comparing the at least one output error against a preset threshold; and
    adjusting an integer input value of the digital-to-analog converter according to a comparison result;

wherein calculating the output error of the digital-to-analog converter according to the output accuracy and the input error of the digital-to-analog converter comprises:
    obtaining a floating point input value;
    performing get-integer operation on the floating point input value to obtain an integer input value;
    calculating the input error by subtracting the floating point input value from the integer input value; and
    calculating the output error obtained after inputting the integer input value into the digital-to-analog converter, the output error equaling the output accuracy times the input error.

2. The method of claim 1, wherein obtaining at least one of the output error and comparing the at least one output error against the preset threshold and adjusting the integer input value of the digital-to-analog converter according to the comparison result comprises:
    accumulating a plurality of consecutive output errors to obtain an accumulative output error;
    in response to determining that the accumulative output error is greater than a first threshold, setting the integer input value of the digital-to-analog converter to an integer part of a floating point input value, until the accumulative output error is less than a second threshold; and
    in response to determining that the accumulative output error is less than the second threshold, setting the integer input value of the digital-to-analog converter to an integer part of a floating point input value plus 1, until the accumulative output error is greater than the first threshold.

3. The method of claim 2, wherein the first threshold has an absolute value that is equal to an absolute value of the second threshold.

4. The method of claim 1, wherein obtaining at least one of the output error and comparing the at least one output error against the preset threshold and adjusting the integer input value of the digital-to-analog converter according to the comparison result comprises:
    calculating times of adjustment according to the output accuracy of the digital-to-analog converter and a desired accuracy, the times of adjustment being greater than or equal to the output accuracy of the digital-to-analog converter divided by the desired accuracy; and
    in response to an absolute value of one of the at least one output error being greater than the preset threshold, inputting a number of integer input values that corresponds to the times of adjustment into the digital-to-analog converter;
    wherein one of the integer input values is set to an integer part of a floating point input value, and the others of the integer input values are set to an integer part of a floating point input value plus 1.

5. A non-transitory storage medium, configured to store computer-executable instructions, the computer-executable instructions being configured for executing a method for improving an output accuracy of a digital-to-analog converter, the method comprising:
    calculating an output error of the digital-to-analog converter based on an output accuracy and an input error of the digital-to-analog converter;
    obtaining at least one of the output error and comparing the at least one output error against a preset threshold; and
    adjusting an integer input value of the digital-to-analog converter according to a comparison result;

wherein calculating the output error of the digital-to-analog converter according to the output accuracy and the input error of the digital-to-analog converter comprises:
    obtaining a floating point input value;
    performing get-integer operation on the floating point input value to obtain an integer input value;
    calculating the input error by subtracting the floating point input value from the integer input value; and
    calculating the output error obtained after inputting the integer input value into the digital-to-analog converter, the output error equaling the output accuracy times the input error.

6. The non-transitory storage medium of claim 5, wherein obtaining at least one of the output error and comparing the at least one output error against the preset threshold and adjusting the integer input value of the digital-to-analog converter according to the comparison result comprises:
    accumulating a plurality of consecutive output errors to obtain an accumulative output error;
    in response to determining that the accumulative output error is greater than a first threshold, setting the integer input value of the digital-to-analog converter to an integer part of a floating point input value, until the accumulative output error is less than a second threshold; and
    in response to determining that the accumulative output error is less than the second threshold, setting the integer input value of the digital-to-analog converter to an integer part of a floating point input value plus 1, until the accumulative output error is greater than the first threshold.

7. The non-transitory storage medium of claim 6, wherein the first threshold has an absolute value that is equal to an absolute value of the second threshold.

8. The non-transitory storage medium of claim 5, wherein obtaining at least one of the output error and comparing the at least one output error against the preset threshold and adjusting the integer input value of the digital-to-analog converter according to the comparison result comprises:
    calculating times of adjustment according to the output accuracy of the digital-to-analog converter and a desired accuracy, the times of adjustment being greater than or equal to the output accuracy of the digital-to-analog converter divided by the desired accuracy; and
    in response to an absolute value of one of the at least one output error being greater than the preset threshold, inputting a number of integer input values that corresponds to the times of adjustment into the digital-to-analog converter;
    wherein one of the integer input values is set to an integer part of a floating point input value, and the others of the integer input values are set to an integer part of a floating point input value plus 1.

9. An electronic device, comprising at least one processor and a memory communicatively coupled to the at least one processor, wherein the memory is configured to store instructions which are executable by the at least one processor, and which, when executed by the at least one processor, cause the at least one processor to perform a method for improving an output accuracy of a digital-to-analog converter, the method comprising:
    calculating an output error of the digital-to-analog converter based on an output accuracy and an input error of the digital-to-analog converter;

obtaining at least one of the output error and comparing the at least one output error against a preset threshold; and adjusting an integer input value of the digital-to-analog converter according to a comparison result;

wherein calculating the output error of the digital-to-analog converter according to the output accuracy and the input error of the digital-to-analog converter comprises:

obtaining a floating point input value;

performing get-integer operation on the floating point input value to obtain an integer input value;

calculating the input error by subtracting the floating point input value from the integer input value; and calculating the output error obtained after inputting the integer input value into the digital-to-analog converter, the output error equaling the output accuracy times the input error.

10. The electronic device of claim 9, wherein obtaining at least one of the output error and comparing the at least one output error against the preset threshold and adjusting the integer input value of the digital-to-analog converter according to the comparison result comprises:

accumulating a plurality of consecutive output errors to obtain an accumulative output error;

in response to determining that the accumulative output error is greater than a first threshold, setting the integer input value of the digital-to-analog converter to an integer part of a floating point input value, until the accumulative output error is less than a second threshold; and in response to determining that the accumulative output error is less than the second threshold, setting the integer input value of the digital-to-analog converter to an integer part of a floating point input value plus 1, until the accumulative output error is greater than the first threshold.

11. The electronic device of claim 10, wherein the first threshold has an absolute value that is equal to an absolute value of the second threshold.

12. The electronic device of claim 9, wherein obtaining at least one of the output error and comparing the at least one output error against the preset threshold and adjusting the integer input value of the digital-to-analog converter according to the comparison result comprises:

calculating times of adjustment according to the output accuracy of the digital-to-analog converter and a desired accuracy, the times of adjustment being greater than or equal to the output accuracy of the digital-to-analog converter divided by the desired accuracy; and in response to an absolute value of one of the at least one output error being greater than the preset threshold, inputting a number of integer input values that corresponds to the times of adjustment into the digital-to-analog converter;

wherein one of the integer input values is set to an integer part of a floating point input value, and the others of the integer input values are set to an integer part of a floating point input value plus 1.

* * * * *